United States Patent [19]
Swenson

[11] Patent Number: 5,039,861
[45] Date of Patent: Aug. 13, 1991

[54] WIRE SHADOW EMITTANCE SCANNER

[75] Inventor: Donald A. Swenson, San Diego, Calif.

[73] Assignee: Science Applications International Corporation, San Diego, Calif.

[21] Appl. No.: 554,796

[22] Filed: Jul. 18, 1990

[51] Int. Cl.[5] .......... H01J 37/244
[52] U.S. Cl. .......... 250/397; 324/71.3
[58] Field of Search .......... 250/397; 324/71.3

[56] References Cited

U.S. PATENT DOCUMENTS

| | | | |
|---|---|---|---|
| 3,600,580 | 8/1971 | Vogel | 324/71.3 |
| 4,700,068 | 10/1987 | McClung et al. | 250/397 |
| 4,701,616 | 10/1987 | West et al. | 250/397 |

OTHER PUBLICATIONS

Schneider et al., "Use of Wire Shadows for Acceleration Beam Diagnostics", APS Sprin Meeting (Apr. 18–21, 1988).

*Primary Examiner*—Jack I. Berman
*Attorney, Agent, or Firm*—Fitch, Even, Tabin & Flannery

[57] ABSTRACT

A beam emittance measuring apparatus suitable for use with small diameter beams of the type commonly found in accelerators and beam transport systems. The apparatus includes a U-shaped frame that supports four thin wires that traverse the particle beam to create and detect thin particle shadows in the particle distribution. Two of the wires are shadow wires and are supported on one side of the U-shaped frame. Two of the wires are detection wires and are supported on the other side of the U-shaped frame, downstream from the shadow wires. One shadow wire and its corresponding detection wire are positioned to detect emittance data at a given point in a first emittance plane. The other shadow wire and its corresponding detection wire are positioned to detect emittance data at a given point in a second emittance plane. A given shadow wire and its corresponding detection wire are generally at right angles to each other so that the point of insertion defines the point at which the emittance measurement is made, much as the cross-hairs on a sighting device define a point being sighted. The location of the particle shadow on the detection wire provides a measure of the emittance angle of the particular beam particle whose shadow is cast by the shadow wire. The location of the particle shadow on the detection wire is detected optically using a concave mirror mounted in one side of the U-shaped frame that collects the image of the detection wire and focuses it on a segmented detector mounted in the other side of the U-shaped frame.

20 Claims, 5 Drawing Sheets

WIRE SHADOW EMITTANCE SCANNER

BACKGROUND OF THE INVENTION

The present invention relates to measurement apparatus for measuring the emittance of small diameter beams, e.g., charged particle beams, of the type found in accelerators and beam transport systems.

Various types of accelerators are currently available for accelerating charged particles, e.g., atomic sized particles (ions), to very high velocities. At high velocities, such particles exhibit significant kinetic energy and may be considered as a "beam" that can be used advantageously for research, medical, industrial or military applications.

An emittance scanner is a measurement tool or device used to characterize the quality of a charged particle beam. More particularly, an emittance scanner measures the "emittance" of a beam, defined below. As its name suggests, an emittance scanner scans a cross section of the beam in order to characterize the beam at each point in the beam.

To better understand the concept of beam "emittance", reference is made to FIG. 1 where there is shown a schematic representation of a diverging beam 12. (It is noted, of course, that not all beams are diverging. The diverging beam of FIG. 1 is merely cited as an example of one type of beam.) Because a beam of charged particles is comprised of many individual charged particles, each of which may follow a somewhat different path, the beam 12 is schematically represented in FIG. 1 as several lines. Each line may be considered as the path followed by a different charged particle within the beam. Using the XYZ coordinate system shown in FIG. 1, the beam 12 is generally moving in the Z direction. Because a diverging beam is represented, the lines representing the beam are grouped closer together at a first point $z_1$ along the Z-axis than they are at a second point $z_2$ along the Z-axis, where $z_2 > z_1$, i.e., the first point $z_1$ is upstream from the second point $z_2$.

At any point along the beam axis z, it is useful to examine the beam and characterize each point of the beam in the cross section, i.e., each point in the X-Y plane, by an angle measurement that indicates whether a beam particle at that particular point of the scanned cross section is moving away from or towards the Z-axis. These angular deviations from the Z-axis are typically represented by the rates of change of the transverse coordinates (x and y) with respect to z, or $x' = dx/dz$ and $y' = dy/dz$. The ensemble of points representing the beam occupy a certain region or regions in the four-dimensional phase space, x-x'-y-y'. Projections of this region on the x-x' and y-y' phase planes represent the common two-dimensional descriptions of the beam. Such two-dimensional descriptions may be plotted for each axis in an X-Y plane, with one axis (e.g., the horizontal axis) of the plot being the scan axis, and the other axis (e.g., the vertical axis) being the measured angle. For a beam that is diverging (expanding) as represented in FIG. 1, such a plot of points (obtained by scanning the beam along the X-axis) may appear as shown in FIG. 2, with the shaded area $A_X$ representing the distribution of the data points thus measured. (A similar plot may be made for scanning along the Y-axis, resulting in a similar area $A_Y$ of the distribution of data points thus measured.) Such a plot is referred to as an emittance plot, and the data thus obtained may be referred to as an emittance plane. There are thus two emittance planes, one resulting from scanning the beam cross section in the X-axis direction, the other by scanning in the Y-axis direction.

The area A for an X-emittance plane (and a similar area $A_Y$ for a Y-emittance plane) may be considered as the area occupied by the beam. This area, divided by $\pi$, is numerically defined as the "emittance" of the beam for that particular emittance plane. It is noted that the beam area, as plotted in an emittance plane such as shown in FIG. 2, will always be constant for a given beam at all points along the beam path providing there are no beam losses. However, the shape and location of the data points plotted on the emittance plane will vary significantly depending upon the characteristics of the beam at the point in the beam path where the emittance measurement is made. Thus, it is the shape and location of the beam area (e.g., $A_X$ or $A_Y$) on the emittance plane that provide the most useful information in characterizing a given beam.

Thus, the areas of the two-dimensional projections and the volume of the four-dimensional region constitute important measures of the quality of the beam, as these measures remain relatively unchanged in the course of beam transport. However, the orientation of these areas and volumes change during beam transport. The objective of a beam emittance measurement is thus to measure the areas, volumes and orientations of these two, three, and four-dimensional phase spaces.

For a more thorough description of beam emittance, and the techniques known in the art for measuring beam emittance, see, e.g., Steffan, K. G., *High Energy Beam Optics* (Interscience, New York 1965).

One of the more common techniques known in the art for measuring beam emittance is to use a mini-scanner 22 such as is schematically depicted in FIG. 3. The mini-scanner 22 comprises a box 23, typically about 4 inches in length, having a front face 24 with a small aperture or slit 26 therein. The front face 24 is designed to intercept a beam 20. All but a very small portion of the beam 20 is absorbed by the front face 24 of the scanner 22. A small portion of the beam 27 passes through the aperture 26 and is detected by a linear collector 28. The collector 28 includes appropriate electronic circuitry for generating a detection signal, represented in FIG. 3 by the signal waveform 29, that indicates the relative location on the front of the collector 28 where the beam portion 27 is detected. This location, relative to the fixed reference location of the aperture 26, thus provides a measure of the angle of the beam portion 27 within the beam 20. The entire scanner 22 is scanned through the cross section of the beam 20 in the direction indicated by the arrow 30. Typically, suitable mechanical means are employed to position the scanner 22 at N stops as it is scanned through the beam 20, with a separate measurement being made at each stop. The scan direction is first made in one direction, e.g., the X-axis direction, to enable an X-axis emittance plot to be generated. Then, as required, the measurement is repeated by scanning in the Y-axis direction, to enable a Y-axis emittance plot to be made. Often, two separate mini-scanners are employed, one to measure the X-emittances and the other to measure the Y-emittances.

The prior art mini scanner 22 described above is advantageously simple in construction, small in size, and correspondingly modest in cost. As a result, it has enjoyed widespread use and has been accepted as an international standard for beam emittance measurement. However, there are numerous kinds and types of measurements that are not possible with such a scanner.

For example, an "on-line" measurement of beam emittance, i.e. a measurement of the beam emittance without significantly interrupting or disturbing the beam (so that the beam can continue to be used for a particular application) is not possible. This is because an emittance measurement made with the mini scanner 22 is totally (100%) destructive of the measured beam because the scanner completely blocks the beam path. Due to the complete interruption of the beam, the beam is thus not available for any other purpose while the emittance measurement is being made. Further, tandem measurements of the beam emittance are not possible (i.e., simultaneous beam emittance measurements at different locations along the beam path). Moreover, the beam emittance measurement measures only one emittance plane (the plane obtained by scanning the X-axis, or the plane obtained by scanning the Y-axis), and hence a measurement of both emittance planes requires two separate measurements and is thus somewhat labor intensive.

Also, it is known that use of the mini-scanner has some effect on beam neutralization. That is, insertion of the scanner 22 into the beam path 20 perturbs to some degree the true characteristics of the beam. Thus, there is some degree of uncertainty always present in any beam emittance measurement made with such a device. Further, the device absorbs all of the beam energy, and thus some provision must be made to remove the heat resulting from such absorbed energy, as well as to handle any radiation that may be present from the absorbed beam.

In view of the above, it is evident that what is needed is a new beam emittance measuring device that offers all the advantages of the prior art mini scanner (e.g., small in size and modest in cost), but that also allows on-line measurements, intercepting only a very small percentage of the beam; allows tandem measurements; and readily measures both emittance planes. Further, such a new device would preferably not neutralize a charged particle beam, and would absorb minimal beam energy. The present invention advantageously provides a beam emittance measurement device that addresses these and other needs.

SUMMARY OF THE INVENTION

In accordance with one aspect of the present invention, there is provided a beam emittance measuring apparatus that is suitable for use on small diameter beams of the type commonly found in accelerators and beam transport systems. The apparatus includes a U-shaped frame that supports four thin wires that traverse the particle beam to create and detect thin shadows in the particle distribution. Two of the wires are shadow wires and are supported on one side of the U-shaped frame. Two of the wires are detection wires and are supported on the other side of the U-shaped frame, downstream (or "downbeam") from the shadow wires. One shadow wire and its corresponding detection wire are positioned to best detect emittance data at a given point in a first emittance plane, e.g., the X-emittance plane. The other shadow wire and its corresponding detection wire are positioned to best detect emittance data at a given point in a second emittance plane, e.g., the Y-emittance plane. A given shadow wire and its corresponding detection wire are generally at right angles to each other, as viewed along the beam axis, so that the point of intersection defines the point at which the emittance measurement is made, much as the cross-hairs on a sighting device define a point being sighted. Advantageously, the location of the particle shadow on the detection wire provides a measure of the emittance angle of the particular beam particle whose particle shadow is cast by the shadow wire.

The location of the particle shadow on the detection wire is detected optically using a concave mirror embedded in one side of the U-shaped frame. This mirror collects the shadow image of the detection wire and focuses it on a segmented detector embedded in the other side of the U-shaped frame. In a preferred embodiment, the location of the shadow image on the segmented detector is enhanced by coating the detector wire with a suitable scintillating material (i.e., a material that emits light in proportion to the beam density along the wire). Thus, all portions of the detection wire, except those in the shadow of the shadow wire, emit light. The image of the detector wire focused in the segmented detector is thus more clearly characterized with a shadow location. The shadow location is converted to an electrical signal using conventional segmented detection circuitry. Appropriate processing circuitry is then used to convert the electrical signals generated from all of the points scanned within the beam to a measure of the beam emittance.

Conventional means are used to impart linear and transverse motion to the U-shaped frame in order to scan the shadow and detection wires through a cross section of the beam. Additional motion, e.g., tilting of the U-shaped frame, may also be selectively used to enhance other types of measurements.

In accordance with another aspect of the invention, the wire shadow emittance scanner device is extremely compact, typically requiring only about one inch of beam length, and is virtually transparent to the measured beam. Hence, on-line and tandem measurements of beam emittance and beam profile measurements can be made without significantly altering or interfering with the measured beam. This is a significant advantage because it allows the beam to be used for whatever purpose is at hand at the same time that a measurement is being made. Further, very little energy is absorbed by the device, thereby reducing unwanted thermal, radiation, vacuum and neutralization effects that have always been of concern with the prior art devices.

One embodiment of the invention may be characterized as measurement apparatus for measuring desired properties of a particle beam, such as a proton beam, that includes a stream of charged particles following a beam axis in a region bounded by a beam radius. For ease of description, it is assumed that the beam axis is aligned with a z-axis of an XYZ coordinate system. The measurement apparatus comprises: (1) a shadow wire secured to support structure about the beam, this shadow wire lying in a first XY plane that traverses the beam; and (2) a detection wire secured to the support structure, this detection wire lying in a second XY plane that traverses the beam downstream from the first XY plane. The detection wire is oriented relative to the shadow wire so that a particle shadow cast behind the shadow wire, as a result of a particle in the beam striking the shadow wire at a particular angle of incidence, falls upon the detection wire at a position along the length of the detection wire that varies as a function of the angle of incidence. Further, there is included in the apparatus means for detecting the position of the shadow along the length of the detection wire, as well as transversely moving the support structure, and hence the shadow and detection wire, relative to the beam axis.

It is a feature of the invention to provide a beam emittance measuring device that is extremely compact, typically requiring only about one inch of beamline space, and modest in cost.

It is a further feature of the invention to provide such a compact beam emittance measuring device that is essentially transparent to the measured beam, thereby allowing on-line measurements of the beam to be made while the beam is "on-line" for some other purpose. Advantageously, such transparency allows two or more simultaneous measurements to be made in tandem. Such transparency further reduces significantly the amount of energy absorbed by such device, thereby minimizing thermal, vacuum, neutralization and radiation effects.

It is another feature of the invention to provide such a beam measuring device that measures both X and Y beam emittances and/or beam profiles using the same device.

Another feature of the invention provides a transparent beam measuring device that also allows some higher order effects to be measured or characterized.

An additional feature of the invention provides a beam emittance measuring device that has a simple data interface, thereby allowing conventional data processors, such as a personal computer, to be used for processing the measured data.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
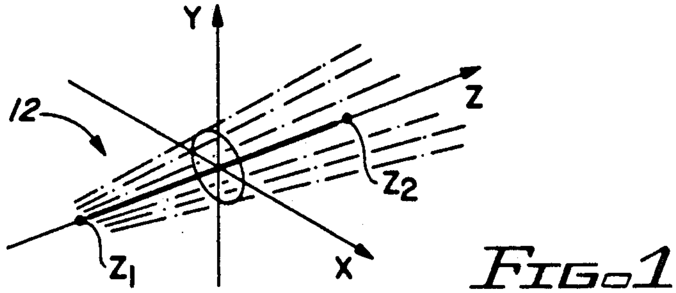
FIG. 1 schematically shows a diverging beam.
Figure 2:
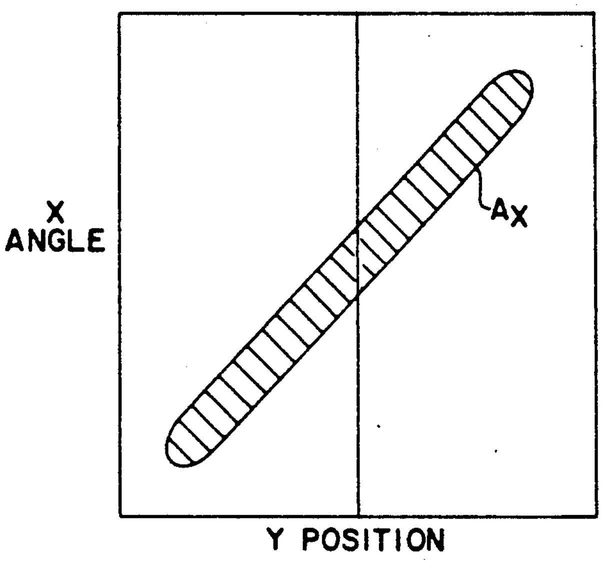
FIG. 2 illustrates the concept of "emittance" as that term is used to characterize the beam of FIG. 1 along one of its axes.
Figure 3:
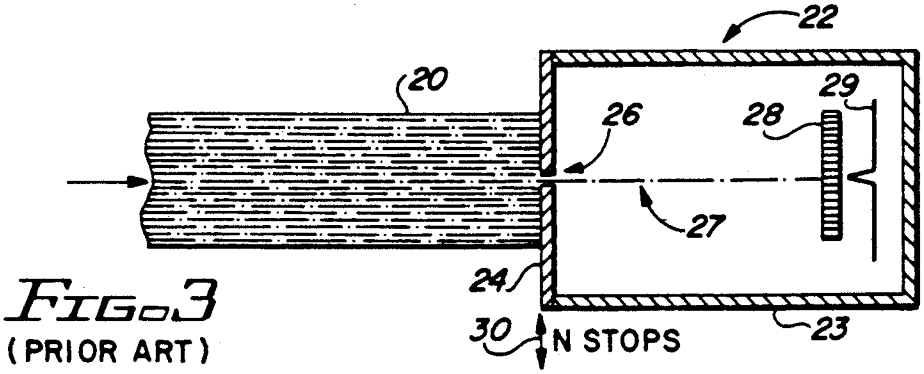
FIG. 3 (PRIOR ART)
FIG. 3 schematically illustrates the manner in which emittance is measured using a prior art device.

FIGS. 1, 2 and 3 were described above in the background portion of the application in connection with the description of beam emittance and the prior art method of measuring beam emittance.

Figure 4:
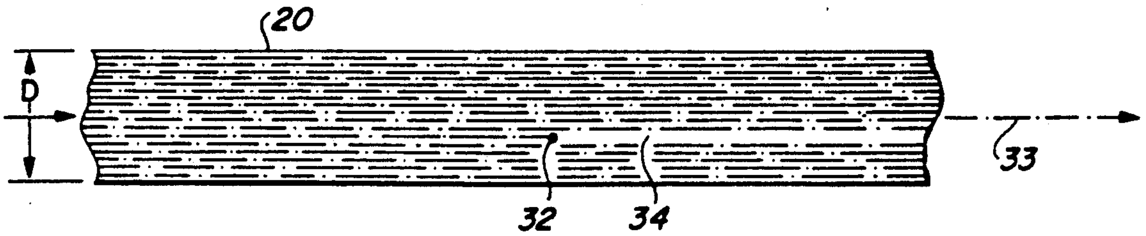
FIG. 4 illustrates how a particle shadow is formed behind a thin wire passing transversely through a beam.

FIG. 4 schematically depicts a charged particle beam 20 through which a wire 32 is passed transverse to the beam axis. The charged particle beam comprises a stream of charged particles that follow a beam axis 33 within a region confined to a diameter D centered about the beam axis 33. As drawn in FIG. 4, the particles are moving from left to right. The wire 32 has a small diameter compared with the diameter of the beam 20, but a large diameter compared with the size of the particles in the beam. Hence, most of the charged particles in the beam 20 pass by the wire 32 uninterrupted. However, a small number of the charged particles are intercepted by the wire 32. These intercepted particles thus leave a void, or particle shadow 34, downstream from the wire 32. It is the creation of this shadow 34 by the wire 32 that provides the basis for operation of the measurement apparatus of the present invention.

Figure 5A:
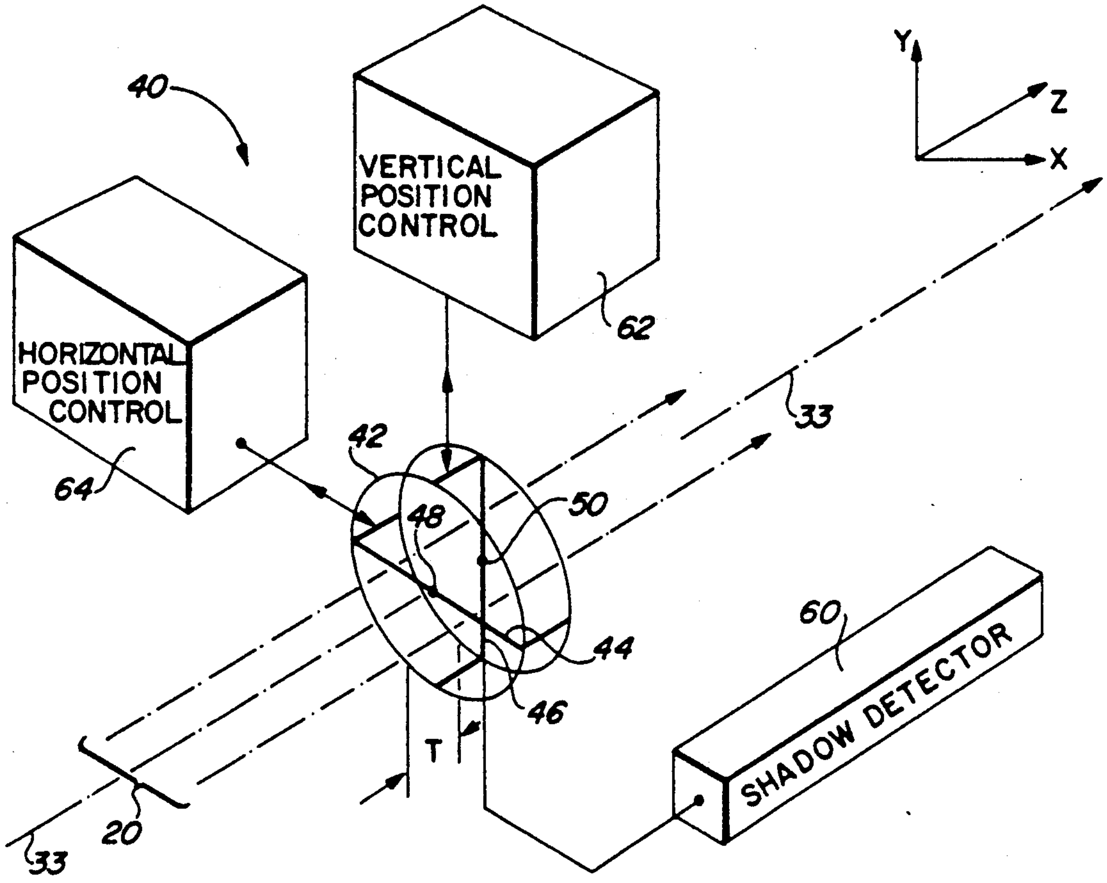
FIG. 5A shows a simplified block diagram of the wire shadow emittance scanner of the present invention, illustrating how a particle shadow formed by a shadow source wire at a given point in a beam cross section is detected by a detection wire positioned downstream from the shadow wire.

Referring next to FIG. 5A, there is shown a block diagram of a wire shadow emittance scanner 40 for measurement of beam emittance in only one plane (the Y-plane). The apparatus is shown in connection with a charged particle beam 20 following a beam axis 33. The beam axis 33 is aligned with a Z axis of an XYZ coordinate system. Support structure 42 surrounds the beam 20. This support structure may take any form, but in general must provide adequate support for shadow and detection wires, as described below, to pass through the beam 20 in an XY plane. In FIG. 5A, for example, the support structure resembles a hoop having a thickness T. The hoop lies in an XY plane. More particularly, the front or leading edge of the hoop defines a first XY plane, and the back or trailing edge of the hoop defines a second XY plane parallel to the first XY plane. The separation between the first and second XY planes is the thickness of the hoop, T.

A shadow wire 44 is stretched across the leading or front edge of the support structure 42 so as to lie in the first XY plane. This shadow wire is aligned with the X axis of the XYZ coordinate system. A detection wire 46 is stretched across the back or trailing edge of the support structure 42 so as to lie in the second XY plane. This detection wire is aligned with the Y axis of the XYZ coordinate system. Hence, when viewed from the front of the support structure, looking down the z axis in the direction of travel of the beam 20, the two wires 44 and 46 appear perpendicular to each other, much as the cross-hairs on a sighting device. The overlap point defined by the wires 44 and 46 represents a measurement point 48 of the beam cross section that is measured by the device 40.

A particle shadow is created behind (downstream from) the shadow wire for any particles in the beam 20 that strike the shadow wire 44. For a particular charged particle in the beam that strikes the measurement point 48, a corresponding shadow point 50 will be present on the detection wire 46. Significantly, the location of the shadow point 50 on the detection wire 50 moves along the length of the detection wire as a function of the angle of incidence of the charged particle with the shadow wire. This concept is illustrated in FIG. 5B, where exaggerated divergences of an incident particle beam on a shadow wire 44' are depicted.

Figure 5B:
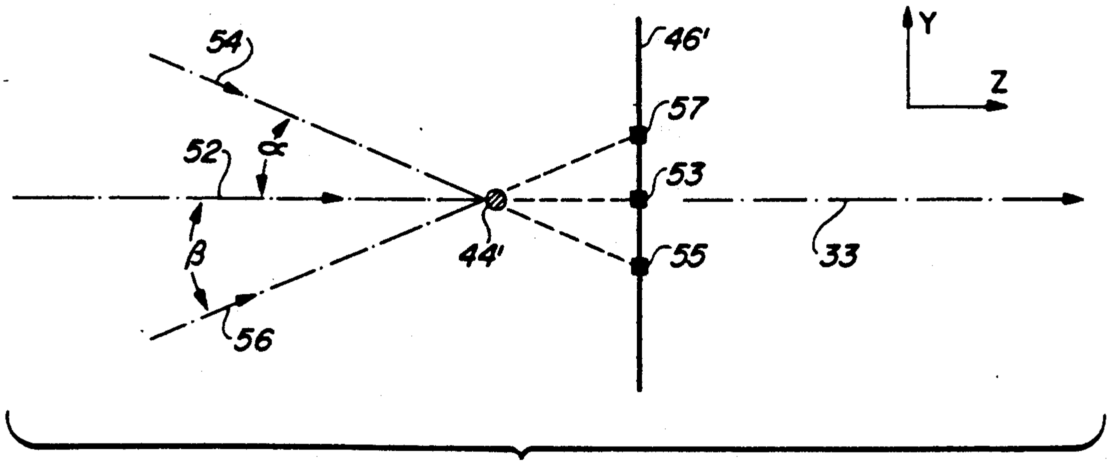
FIG. 5B illustrates how the position of a particle shadow on a detection wire moves along the length of the detection wire as a function of the angle of incidence of the particle with shadow source wire.

As seen in FIG. 5B, for an incident particle beam path 52 coincident with the beam axis 33 (corresponding to an incident angle of zero), a shadow point 53 is cast on the detection wire 46' immediately behind the shadow wire 44'. For an incident particle beam path 54 striking the shadow wire 44', having an incident angle of $\alpha$ (relative to the beam axis 33), a shadow point 55 is cast on the detection wire 46' below the axis 33. Similarly, for an incident particle beam path 56 striking the shadow wire 44', having an incident angle of $\beta$, a shadow point 57 is cast on the detection wire 46' above the axis 33. Hence, the linear position of the shadow point on the detection wire provides a measure of the incident angle of the particle path responsible for the shadow point.

Returning to FIG. 5A, the present invention utilizes a shadow detector 60 for the purpose of determining the location on the shadow wire 46 where a given shadow point is located. Further, the invention utilizes a vertical position control mechanism 62 and a horizontal position control mechanism 64 for positioning the measurement point 48 on the shadow wire 44 at a desired location within the cross section of the beam 20. Thus, by selectively positioning the measurement point 48 at all desired locations in the beam cross section, i.e., by systematically moving the measurement point 48 to all points of interest in the first XY plane that are intersected by the beam 20, and by measuring the corresponding location of the shadow point 50 for all such point locations, a set of data is generated from which the beam emittance measurement is derived.

Figure 6:
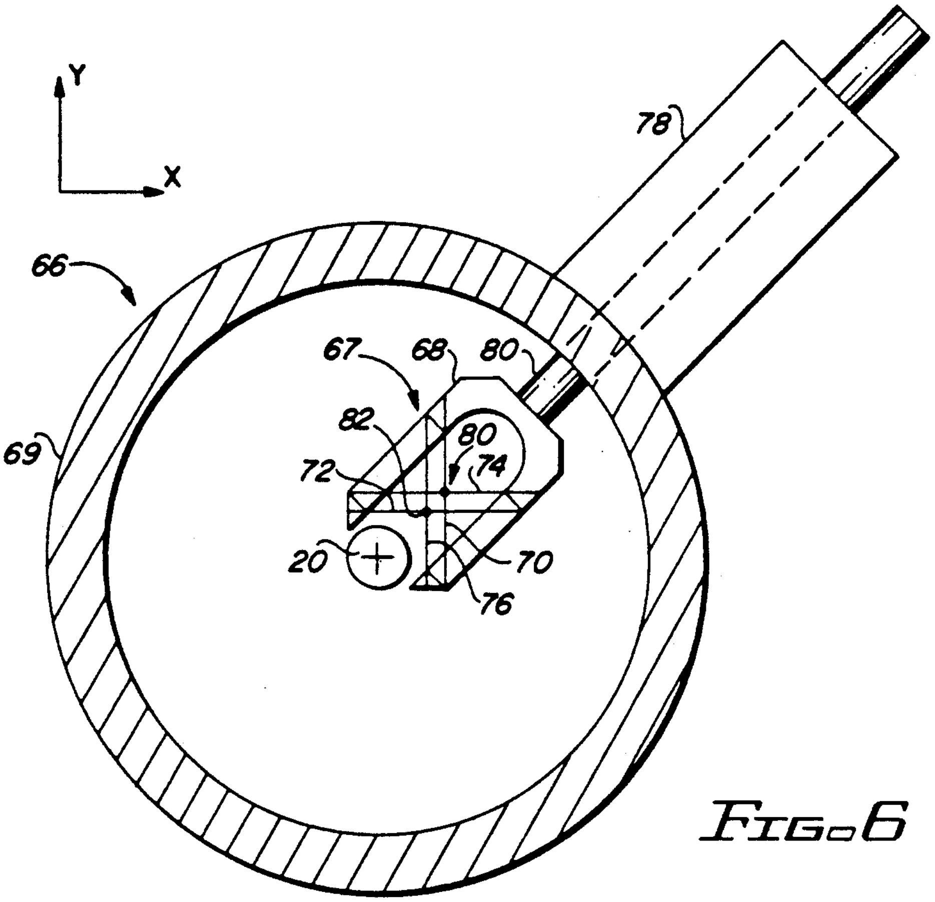
FIG. 6 depicts a preferred embodiment of a wire shadow emittance scanner made in accordance with the present invention.

Turning next to FIG. 6, a preferred embodiment of a wire shadow emittance scanner 66 made in accordance with the present invention is illustrated. The device comprises a head assembly 67 that is supported for controlled movement within a diagnostic spool 69. Typically, for most charged particle beams, a vacuum will be established within the beam diagnostic spool 69. The head assembly 67 includes a U-shaped support frame 68 that supports a first shadow wire 70, a second shadow wire 72, a first detection wire 74, and a second detection wire 76. The inside width of the U-shaped frame is wide enough for the beam 20 to fit within the U-shaped frame without striking the sides of the U-shaped frame. Further, the depth of the U-shaped frame, i.e., the inside length of each side of the "U" is at least twice as long as the diameter of the beam 20. A linear actuator 78, secured to the diagnostic spool 69, provides linear movement of the head assembly 67 radially into and out of the diagnostic spool 69 via a control arm 80, thereby moving the U-shaped frame 68 over the beam 20.

As seen in FIG. 6, the shadow wire 72 and the detection wire 74 are aligned parallel with the X axis. Similarly, the shadow wire 70 and the detection wire 76 are aligned with the Y axis. The linear actuator moves the head assembly generally at a 45 degree angle relative to the X and Y planes.

The shadow wire 70 and the detection wire 74 are at right angles with each other and define a first measurement point 80 for the device. Similarly, the shadow wire 72 and the detection wire 76 are at right angles with each other and define a second measurement point 82 for the device.

Figure 7A:
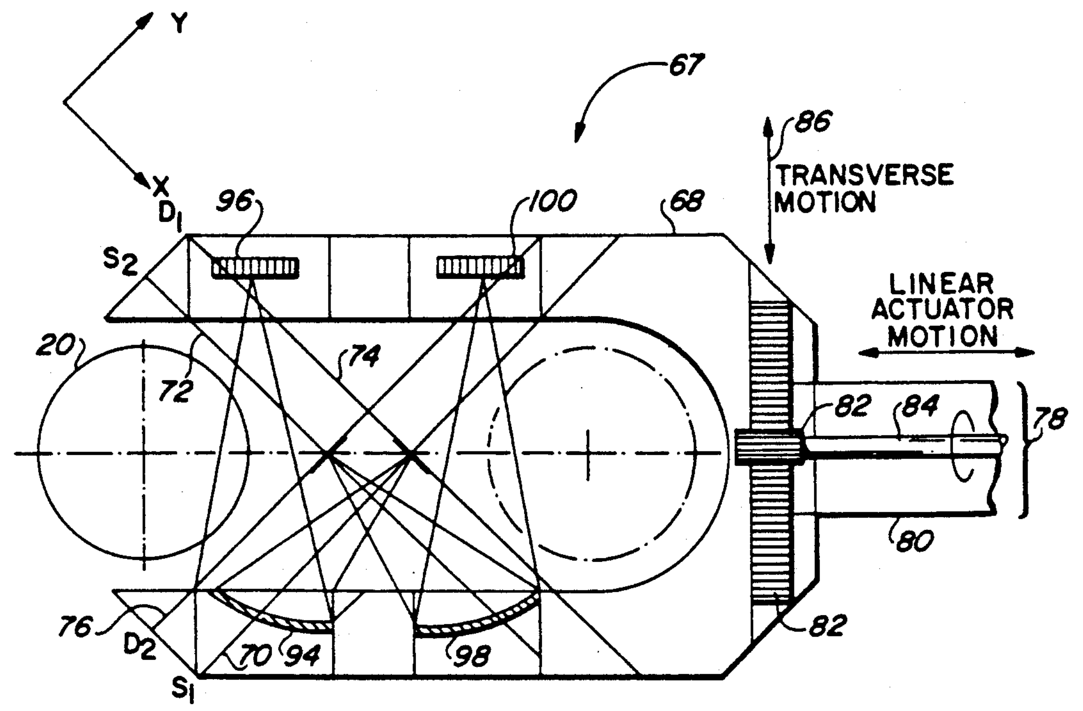
FIG. 7A shows a frontal view of the emittance scanner head used with the scanner of FIG. 6.
Figure 7B:
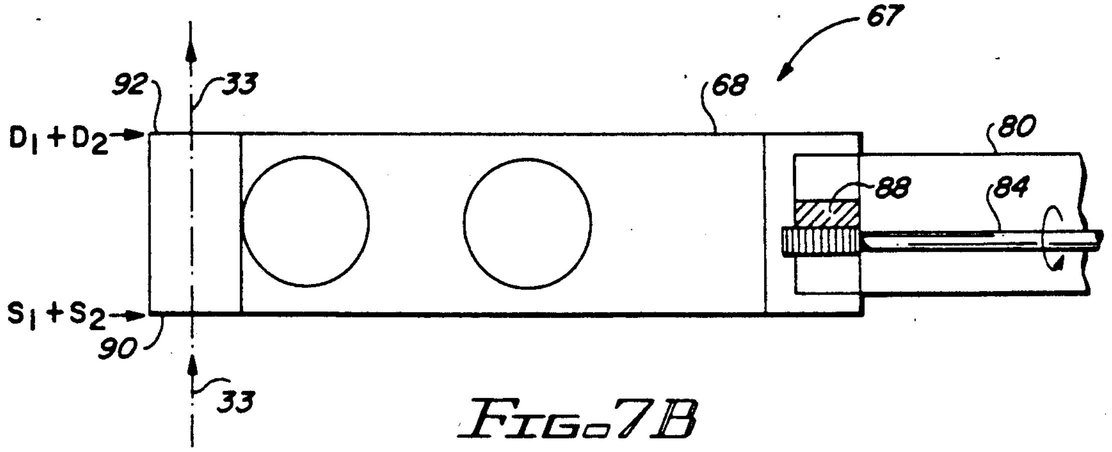
FIG. 7B is a side view of the emittance scanner head of FIG. 7A.

FIG. 7A shows a more detailed frontal view of the emittance scanner head 67 used with the scanner 66 of FIG. 6. FIG. 7B is a side view of the emittance scanner head of FIG. 7A. Note that the head assembly as shown in FIG. 7A is rotated 45 degrees from the orientation shown in FIG. 6. The linear actuator 78 includes a conventional drive screw 82 coupled to a rotatable shaft 84 passing through the arm 80. This drive screw imparts transverse motion, as indicated by the arrow 86, to the entire head assembly 67. A conventional worm gear 88, seen in FIG. 7B, allows the head assembly to move radially in and out of the spool 69. Thus, the head assembly has at least two degrees of motion, linear motion in and out of the spool (along the linear actuator axis), and transverse motion, normal to the linear actuator axis. This allows the "cross-hairs" (the intersection of the shadow wire with the detection wire) of the measurement to be positioned at any point in the cross section of the beam.

As clearly seen in FIG. 7B, the shadow wires 70 and 72 (also referred to as S1 and S2) are mounted to a leading edge 90 of the head assembly 67. This leading edge 90 defines the first XY plane referred to above. Similarly, the detection wires 74 and 76 (also referred to as D1 and D2) are mounted to a trailing edge 92 of the head assembly 67. This trailing edge 92 defines the second XY plane referred to previously.

In operation, the two shadow (source) wires 70 (S1) and 72 (S2) are located on the upstream side of the U-shaped frame 68 and serve to create thin shadows in the particle distribution of the beam 20. The detection wires 74 (D1) and 76 (D2) are located on the downstream side of the frame 68 and are made of a scintillating material, such as quartz, or coated with a suitable scintillating material, such as lantharium boride. When struck by beam particles, the detector wires scintillate in proportion to the beam density along the wire. The shadow of the source wire results in a sharp dip in the beam density at some location on the related detector wire. This dip in beam density results in a corresponding dip in the light output from the scintillating material of the detector wire at that location. The location and shape of this dip in light output (i.e., the location and shape of the particle shadow created on the detection wire) reveals the direction and divergence of the particle beam at the location corresponding to the intersection of the appropriate shadow and detection wires.

The location and shape of the shadow on the respective detection wire is determined by collecting and focusing light from the detector wire onto a CCD (charge-coupled-device) photodiode array. Collecting is accomplished through use of a concave mirror lens. As seen in FIG. 7A, a first concave mirror lens 94 is used to collect light from the detection wire 74. This collected light (which may be considered as an image of the detector wire, or at least an image of the particle shadow on the wire) is then focused onto a first CCD photodiode array 96. A second concave mirror lens 98 is similarly used to collect light from the detection wire 76 and focus it onto a second CCD photodiode array 100.

Figure 8:
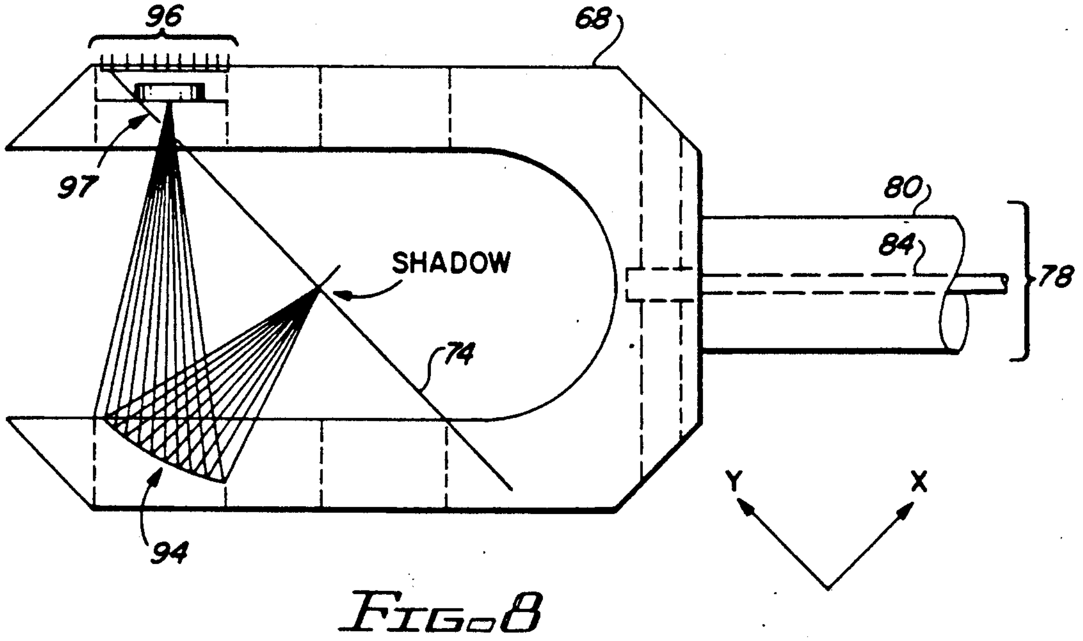
FIG. 8 illustrates operation of the horizontal components (x-axis) of the emittance scanner head of FIG. 7A.

The process of determining the location and shape of the shadow on the respective detection wire is further illustrated in FIG. 8, which figure illustrates the operation of the horizontal components (X-axis) of the emittance scanner head 67 of FIG. 7A. As seen in FIG. 8, the shadow (dip in intensity) on the detection wire 74 is collected in concave lens mirror 94. A shadow image 97 is thereafter focused onto the CCD photodiode array 96. The CCD array 96 is segmented, thereby providing an indication as to the strength or weakness of the image intensity falling upon each segment. The location of the shadow is thus determined by looking for the segment (or segments) containing the lowest intensity signal incident thereon.

Advantageously, both the concave mirrors 94 and 98, as well as the arrays 96 and 100, are preferably embedded into sides of the U-shaped frame 68, thereby protecting these devices from stray light from the U-shaped frame or the vacuum enclosure.

Figure 9:
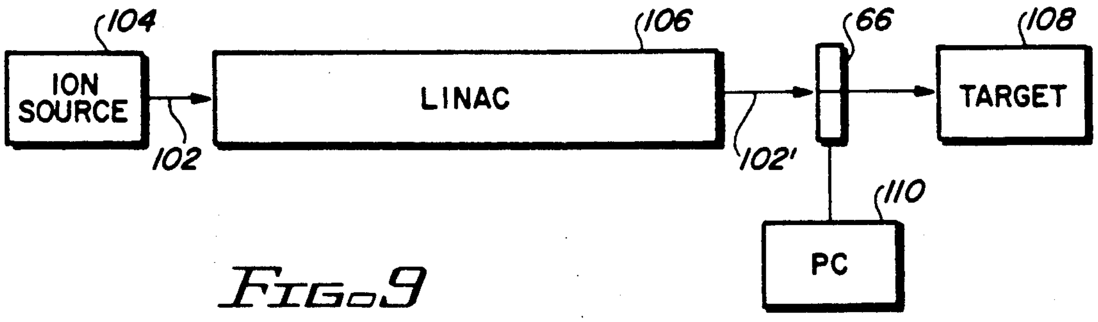
FIG. 9 is a block diagram of a beam delivery system, illustrating how the emittance scanner of the present invention may be used to non-destructively measure the beam emittance.

Referring next to FIG. 9, a block diagram is shown illustrating how the emittance scanner 66 of the present invention may be used to non-destructively measure the beam emittance of a charged particle beam. In general, an ion beam 102 originates with a suitable ion source 104, such as a duoplasmatron. An accelerator 102, such as an RFQ linac 106, may then be used to accelerate the ion beam to a desired energy level. Appropriate controls, not shown, may also be used to pulse the beam at a desired rate. The accelerated output beam 102′ from the linac 106 is then directed to a desired target 108 for a particular application. At any point along the path of the beam 102′, the wire shadow emittance scanner 66 of the present invention may be inserted "in-line" with the beam path to measure the beam emittance. Typically, the emittance scanner 66 absorbs less than 2% of the beam particles, so the beam may continue to be used for whatever purpose is desired during the measurement.

As shown in FIG. 9, the emittance scanner 66 is typically coupled to a suitable data processor, such as a personal computer (PC). Advantageously, the data interface with the PC may be accomplished using commercially available components, e.g., obtained from CamCorded Technology. Conventional means are used to receive and process the signals generated by the photodiode arrays in the scanner. For example, assuming that the beam 20 is a pulsed beam (which is usually the case), following the beam pulse, data from both CCD arrays 96 and 100 (FIG. 7A) are strobed onto a single data line for transfer to external circuitry, e.g., to the PC 110. Further, it is noted that the shadow source wires 70 and 72 may also be connected to external data channels and coupled to the PC 110 in order to allow their use for measurement of X and Y beam profiles.

Figure 10:
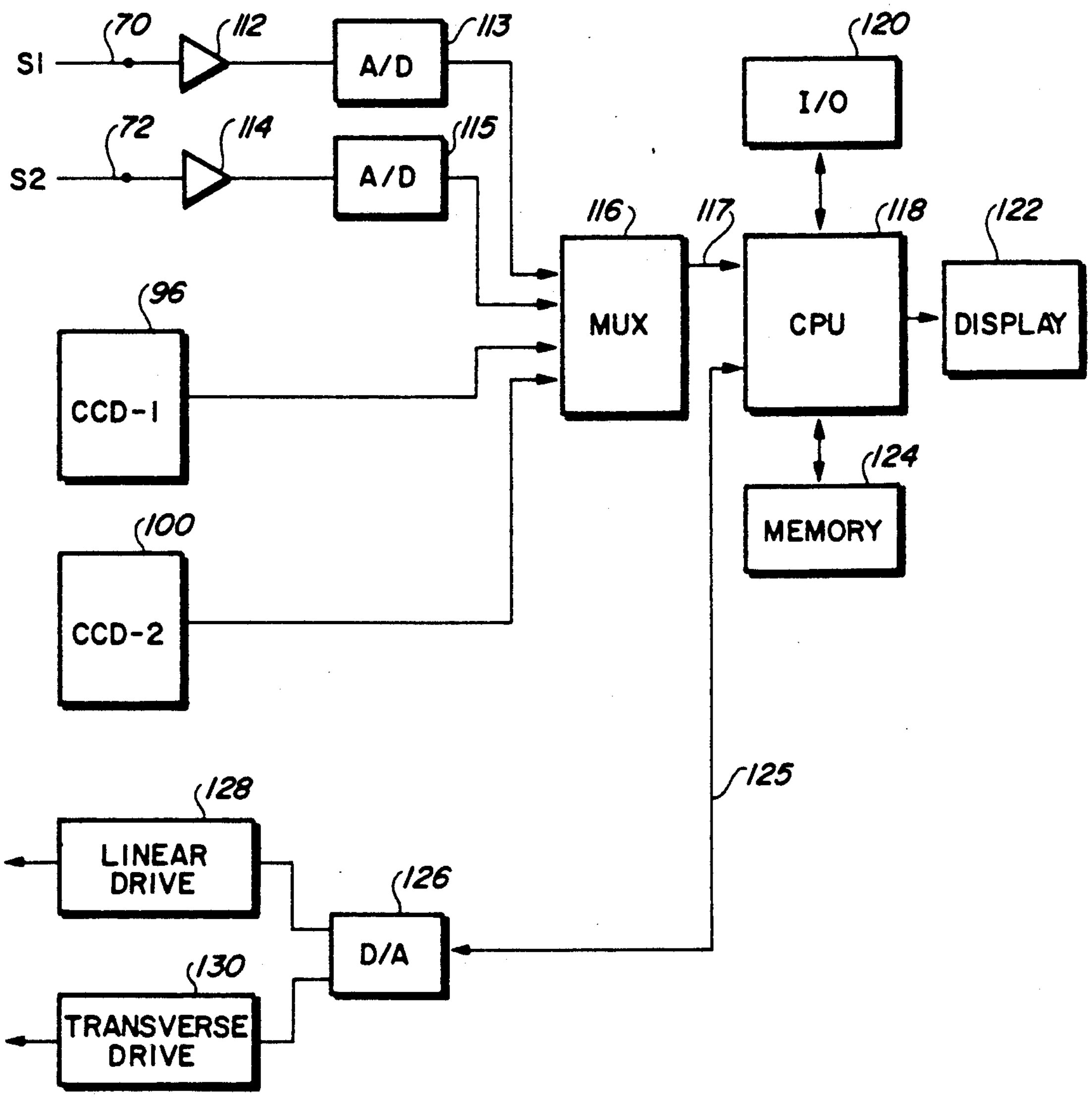
FIG. 10 is a block diagram depicting one manner in which the emittance scanner head of FIGS. 7A and 7B may be coupled to a digital processor.

FIG. 10 shows a simplified block diagram depicting one manner in which the emittance scanner head of FIGS. 7A and 7B may be coupled to and interface with a digital processor, such as the PC 110 (FIG. 9). As seen in FIG. 10, the shadow source wires 70 and 72 are respectively coupled to appropriate buffer amplifiers 112 and 114. The outputs of the amplifiers 112 and 114 are converted to digital signals suitable for use with conventional data processors using analog-to-digital (A/D) converters 113 and 115, respectively. These digital signals, along with the output signals from the CCD arrays 96 and 100, are combined in a suitable multiplexer circuit 116 for delivery to a suitable central processing unit (CPU) 118 over a single data line 117. The CPU 118 may be of conventional design, e.g., a personal computer, such as an IBM AT, IBM 386 or compatible computer. Such CPU 118 includes conventional input/output (I/O) means 120, such as a keyboard and a printer for entering and receiving data. Further, a display device 122, such as a conventional monitor, also provides a visual indication of data and commands processed or generated by the CPU. Finally, a suitable memory device 124 allows measured data to be stored and retrieved as necessary.

Further, if desired, the CPU 118 may also be used to automate the emittance measurement process. For example, control signals may be generated and delivered over data line 125 to a digital-to-analog (D/A) converter 126. The D/A converter 126, in turn, provides analog drive signals that control a linear drive circuit 128 and a transverse drive circuit 130. These drive circuits 128 and 130 are mechanically coupled to the linear actuator used to position the head 67 of the measuring device, thereby positioning the "cross-hairs" of the emittance scanner at a desired location within the beam being measured.

Advantageously, using the emittance scanner as described above, a complete beam measurement may be achieved as follows:

1. The scanner head 67 is plunged through the beam using the shadow source wire signals to determine the X and Y beam profiles and centroids.
2. The scanner head 67 is moved horizontally through the beam (using both degrees of motion) at the vertical centroid of the beam to measure the horizontal (X-plane) emittance.
3. The scanner head is moved vertically through the beam (using both degrees of motion) at the horizontal centroid of the beam to measure the vertical (Y-plane) emittance.
4. If more information on beam nonlinearities are desired, the horizontal and vertical emittances may again be measured at different vertical and horizontal positions, respectively, off of the centroids.

It is significant to note that the emittance scanner described herein also lends itself to investigation of "higher order" effects. Such "higher order" effects result from the numerous and varied interactions and resulting perturbations that accompany a charged particle beam and any foreign obstacle in the vicinity of the beam. For example, most slit-based emittance scanners sum over all Y coordinates in the measurement of the X-X′ phase space, and vice versa. These prior-art emittance measurements represent two-dimensional views of the four-dimensional phase space, x-x′-y-y′, of the beam. These measurements are inadequate to untangle subtle effects on the beam dynamics associated with "higher order" focusing effects and other sources of beam optics aberrations. The wire shadow emittance scanner of the present invention, in contrast, offers three-dimensional views of the four-dimensional beam—a significant advantage in untangling higher-order beam dynamics effects. That is, the emittance scanner of the present invention provides a measure of the X-X′ phase space at any specified Y value, and vice versa. Further, the device may easily be used to display a Y-X′ phase space at any specified X value, and vice versa. Other combinations are also possible. Hence, the versatility of the present invention allows almost any conceivable type of beam measurement to be made. That is, a significant benefit of the wire shadow emittance scanner described herein lies in its potential as an investigation and diagnostic device to help characterize and understand the various subtleties and quirks associated with low energy and high energy beam transport systems of charged particles.

Moreover, as will be evident to those skilled in the art, the wire shadow emittance scanner herein described may be used to measure the phase space density in the three-dimensional phase spaces x-x'-y and y-y'-x.

In conclusion, as seen from the above description, the present wire shadow emittance scanner provides a measure of the direction and angular divergence of the beam in both transverse directions as a function of position—the essential ingredients of an emittance measurement. The device offers a number of distinct advantages over the conventional mini-emittance scanner. First; the device is extremely compact, requiring only about one inch of beamline space. Second the device can measure both X and Y profiles and emittances. Third, the device is extremely transparent, thereby allowing on-line measurements of beam properties, including simultaneous tandem measurements. Fourth, a vast majority (>98%) of the beam passes through the device untouched. Thus, the beam energy absorbed by the device is minimal, thereby reducing unwanted thermal, radiation, neutralization, and vacuum effects. Fifth, the device offers some measure of "higher order" effects by allowing observation of the emittance in each plane at specific locations in the other plane—a new dimension in beam quality information. Other advantages are as described previously.

While the invention herein disclosed has been described by means of specific embodiments and applications thereof, numerous modifications and variations could be made thereto by those skilled in the art without departing from the scope of the invention set forth in the claims.

What is claimed is:

1. Apparatus for measuring the emittance of a charged particle beam, said charged particle beam comprising a stream of charged particles following a beam axis within a region bounded by a beam diameter, said apparatus comprising:

a U-shaped frame having an inside width greater than said beam diameter, an inside length greater than two times said beam diameter, and a thickness greater than one half said beam diameter;

means for controllably passing said U-shaped frame over said beam such that said beam passes through the opening of said U-shaped frame without striking the sides of said U-shaped frame, said beam axis being substantially perpendicular to a plane containing said U-shaped frame;

a pair of shadow wires, each secured to opposite sides of said U-shaped frame proximate a leading edge thereof so as to transversely pass through various portions of said beam when said U-shaped frame is passed over said beam;

a pair of detection wires, each secured to opposite sides of said U-shaped frame proximate a trailing edge thereof, said pair of detection wires being positioned downstream from the pair of shadow wires, said pair of detection wires transversely passing through various portions of said beam when said U-shaped frame is passed over said beam;

a first detection wire of said pair of detection wires being oriented relative to a corresponding first shadow wire of said pair of shadow wires so that a particle shadow cast behind said first shadow wire, as a result of a charged particle in said beam striking said first shadow wire at a particular first angle of incidence, falls upon said first detection wire at a position along the length of said first detection wire that varies as a function of said first angle of incidence;

a second detection wire of said pair of detection wires being oriented relative to a corresponding second shadow wire of said pair of shadow wires so that a particle shadow cast behind said second shadow wire, as a result of a charged particle in said beam striking said second shadow wire at a particular second angle of incidence, falls upon said second detection wire at a position along the length of said second detection wire that varies as a function of said second angle of incidence;

means for detecting the position of said particle shadow along the length of said first and second detection wires; and means for converting the detected position of said shadow along the length of said first and second detection wires to a measure of the emittance of said beam.

2. The beam emittance measuring apparatus as set forth in claim 1 wherein said first shadow wire and said first detection wire are oriented to be substantially at right angles to each other when viewed in the plane of said U-shaped frame.

3. The beam emittance measuring apparatus as set forth in claim 2 wherein said second shadow wire and said second detection wire are oriented to be substantially at right angles to each other when viewed in the plane of said U-shaped frame, whereby said first shadow wire and said second detection wire are substantially parallel to each other, and said second shadow wire and said first detection wire are also substantially parallel to each other.

4. The beam emittance measuring apparatus as set forth in claim 1 wherein said means for detecting the position of the shadow cast on said first and second detection wires comprises optical means for examining an image of said first and second detection wires to determine a shadow point thereon.

5. The beam emittance measuring apparatus as set forth in claim 4 wherein said optical means comprises a first concave mirror mounted to one side of said U-shaped frame for collecting an image of said first detection wire and focusing said image onto a first detection point located on the opposite side of said U-shaped frame, and a second concave mirror mounted to one side of said U-shaped frame for collecting an image of said second detection wire and focusing said image onto a second detection point located on the opposite side of said U-shaped frame.

6. The beam emittance measuring apparatus as set forth in claim 5 wherein said optical means further includes a first segment detector mounted to said U-shaped frame at said first detection point, and a second segment detector mounted to said U-shaped frame at said second detection point, said first and second segment detectors generating respective electrical signals indicative of the relative location of a shadow point, or a region of less intensity, in said focused image.

7. The beam emittance measuring apparatus as set forth in claim 6 wherein said first and second detection wires are coated with a scintillating material, whereby the wires scintillate in proportion to the beam density along their respective lengths, a shadow location thereby not scintillating to the same degree as a non-shadow location.

8. The beam emittance measuring apparatus as set forth in claim 6 wherein said converting means comprises a data processing unit coupled to receive and process the electrical signals generated by said first and second segment detectors.

9. The beam emittance measuring apparatus as set forth in claim 8 wherein said data processing unit is further coupled to said first and second shadow wires, a density signal being detectable in said first and second shadow wires in proportion to the beam density along the respective lengths, said data processing unit being further configured to monitor said density signal of each of said first and second shadow wires for the purpose of determining a beam profile of said beam.

10. The beam emittance measuring apparatus as set forth in claim 6 wherein said plunging means includes means for transversely moving said U-shaped frame relative to said beam axis in two independent directions.

11. The beam emittance measuring apparatus as set forth in claim 10 wherein said plunging means further includes means for tilting said U-shaped frame relative to said beam axis.

12. Beam measurement apparatus for measuring desired properties of a charged-particle beam, said beam comprising a stream of charged particles following a beam axis in a region bounded by a beam radius, said beam axis being aligned with a z-axis of an XYZ coordinate system, said apparatus comprising:

a shadow wire secured to support structure about said beam, said shadow wire lying in a first XY plane that traverses said beam;

a detection wire secured to said support structure, said detection wire lying in a second XY plane that traverses said beam downstream from said first XY plane;

said detection wire being oriented relative to said shadow wire so that a particle shadow cast behind said first shadow wire, as a result of a charged particle in said beam striking said shadow wire at a particular angle of incidence, falls upon said detection wire at a position along the length of said detection wire that varies as a function of said angle of incidence; and means for detecting the position of said shadow along the length of said detection wire.

13. The beam measuring apparatus as set forth in claim 12 further including means for selectively moving said support structure relative to said beam, whereby the location of said shadow and detection wires in said beam can be changed.

14. The beam measuring apparatus as set forth in claim 13 wherein said moving means includes means for moving said support structure in both the X and Y directions.

15. The beam measuring apparatus as set forth in claim 14 further including means for converting the detected position of said particle shadow along the length of said detection wire to a measure of the emittance of said beam.

16. The beam measuring apparatus as set forth in claim 15 wherein said means for detecting the position of the particle shadow cast on said detection wire comprises optical means for monitoring the location of a shadow point along the length of said detection wire.

17. The beam measuring apparatus as set forth in claim 16 wherein said optical means comprises a concave mirror mounted to said support structure for collecting an image of said detection wire and focusing said image onto a segment detector mounted to said support structure, said segment detector generating an electrical signal indicative of the relative location of a shadow point, or a region of less intensity, in said focused image.

18. The beam measuring apparatus as set forth in claim 17 wherein said detection wire is coated with a scintillating material, whereby the detection wire scintillates in proportion to the particle beam density along its length, a particle shadow location thereby not scintillating to the same degree as a non-shadow location.

19. A method of measuring the emittance of a charged particle beam using a wire shadow emittance scanner, said emittance scanner including a scanner head having a pair of orthogonal shadow wires positioned in front of a pair of orthogonal detection wires, said wires being positioned by said scanner head so as to pass in parallel planes transversely through said beam; and means for detecting a shadow cast on either of said detection wires by a charged particle captured by one of said shadow wires; said method comprising the steps of:

(a) plunging the scanner head through the beam in an XY plane, said XY plane being orthogonal to the direction of said beam;

(b) determining the profile and centroid of said beam in both X and Y directions using signals generated in said shadow wires;

(c) moving the scanner head through the beam in an X direction at the Y-direction centroid and measuring the X direction emittance; and (d) moving the scanner head through the beam in a Y direction at the X-direction centroid and measuring the Y direction emittance.

20. The method of claim 19 further including the step of moving the scanner head through the beam in an X or Y direction at different Y or X positions, respectively, said Y or X positions not being on the Y or X centroids, respectively.

* * * * *